US009753504B2

(12) United States Patent
Norton

(10) Patent No.: US 9,753,504 B2
(45) Date of Patent: Sep. 5, 2017

(54) LATCHING MECHANISM FOR A CARRIER TRAY

(71) Applicant: HEWLETT PACKARD ENTERPRISE DEVELOPMENT LP, Houston, TX (US)

(72) Inventor: John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/305,741

(22) PCT Filed: Apr. 28, 2014

(86) PCT No.: PCT/US2014/035695
§ 371 (c)(1),
(2) Date: Oct. 21, 2016

(87) PCT Pub. No.: WO2015/167428
PCT Pub. Date: Nov. 5, 2015

(65) Prior Publication Data
US 2017/0045921 A1   Feb. 16, 2017

(51) Int. Cl.
*H05K 7/16* (2006.01)
*G06F 1/18* (2006.01)
*H05K 7/14* (2006.01)

(52) U.S. Cl.
CPC .............. *G06F 1/183* (2013.01); *G06F 1/181* (2013.01); *H05K 7/1487* (2013.01)

(58) Field of Classification Search
CPC ........ G06F 1/183; G06F 1/181; H05K 7/1487
See application file for complete search history.

(56) References Cited

U.S. PATENT DOCUMENTS

| 4,982,303 A | 1/1991 | Krenz |
| 5,010,426 A | 4/1991 | Krenz |
| 5,325,263 A | 6/1994 | Singer et al. |
| 5,518,412 A | 5/1996 | Larabell |
| 5,721,669 A * | 2/1998 | Becker ................. G11B 33/124 361/679.31 |

(Continued)

OTHER PUBLICATIONS

PCT/ISA/KR, International Search Report, dated Apr. 11, 2016, PCT/US2014/035695.

*Primary Examiner* — James Wu
*Assistant Examiner* — Hung Dang
(74) *Attorney, Agent, or Firm* — International IP Law Group, PLLC

(57) ABSTRACT

A latching mechanism in a carrier tray is provided herein. The latching mechanism may include a sliding rack gear with gear teeth and a lever arm that includes a gear mechanism that engages with the gear teeth of the sliding rack gear. The latching mechanism may include a number of gears, where the gears may operatively couple the sliding rack gear with a first latching member and a second latching member. The first latching member may be disposed along a first end of a sliding rack. The second latching member may be disposed along a second end of the sliding rack. Movement of the lever arm to a closed position may actuate the sliding rack, thereby, simultaneously rotating the first and the second latching members. The simultaneous rotation of the latching members may supply a balanced force of pressure upon the carrier tray to alleviate the binding of connectors.

11 Claims, 9 Drawing Sheets

(56) References Cited

U.S. PATENT DOCUMENTS

| | | | |
|---|---|---|---|
| 6,354,164 B1 | 3/2002 | Megason et al. | |
| 6,394,509 B1 * | 5/2002 | Kurek, III | G11B 33/124 |
| | | | 292/199 |
| 7,027,309 B2 | 4/2006 | Franz et al. | |
| 7,108,524 B2 | 9/2006 | Wahler | |
| 9,137,921 B2 * | 9/2015 | Zhu | H05K 7/1487 |
| 9,462,719 B2 * | 10/2016 | Wu | |
| 2006/0067063 A1 | 3/2006 | Stahl | |
| 2011/0279973 A1 | 11/2011 | Terwilliger et al. | |

\* cited by examiner

200

200

400

LATCHING MECHANISM FOR A CARRIER TRAY

BACKGROUND

Computing centers often contain large numbers of individual computing components, such as servers, switches, and the like. To facilitate servicing and replacement, the individual computing components are often mounted on planar structures, called carrier trays, which are designed to be inserted into slots within frames. The frames usually include connectors designed to make electrical connections with connector pins located on along a backside of the individual computing components once inserted into the slots.

BRIEF DESCRIPTION OF THE DRAWINGS

The advantages of the present techniques are better understood by referring to the following detailed description and the attached drawings, in which.

DETAILED DESCRIPTION OF SPECIFIC EXAMPLES

A slot may be an opening in a frame to accommodate the insertion or removal of a removable computing component, where the removable computing component may include a carrier tray. The carrier tray may include, among other components, a latching mechanism coupled to lever arms to provide a force to push the removable computing component into the slot. This may assist the mating of connectors on the carrier tray with connectors at the back of the slot of the frame during insertion of the removable computing component.

In many systems, a user may use both hands to simultaneously actuate the lever arms, which may be, for example, located at the front of the carrier tray, to facilitate the mating between the connectors of the carrier tray and the connectors of the slot. However, an uneven application of force to the lever arms may cause the latching mechanisms to exert an unbalanced force on the carrier tray. The unbalanced force may cause the connectors of the carrier tray to miss the corresponding connectors, or even to bind in the slot. Binding may include the misalignment, disconnection, or dislodging of the connectors during mating with the corresponding connectors. Binding can place stress on the connectors that may lead to damage. Further, if mating between the pin connectors is incomplete, electrical connectivity between the connectors of the carrier tray and the connectors of the slot may not be established.

Examples described herein describe a latching mechanism for a carrier tray that uses a single lever arm to activate latching mechanisms on each side of the carrier tray. This design may provide a balanced force on the carrier tray and assist in directly mating the connectors of the carrier tray with connectors at the rear of the slot.

Figure 1:
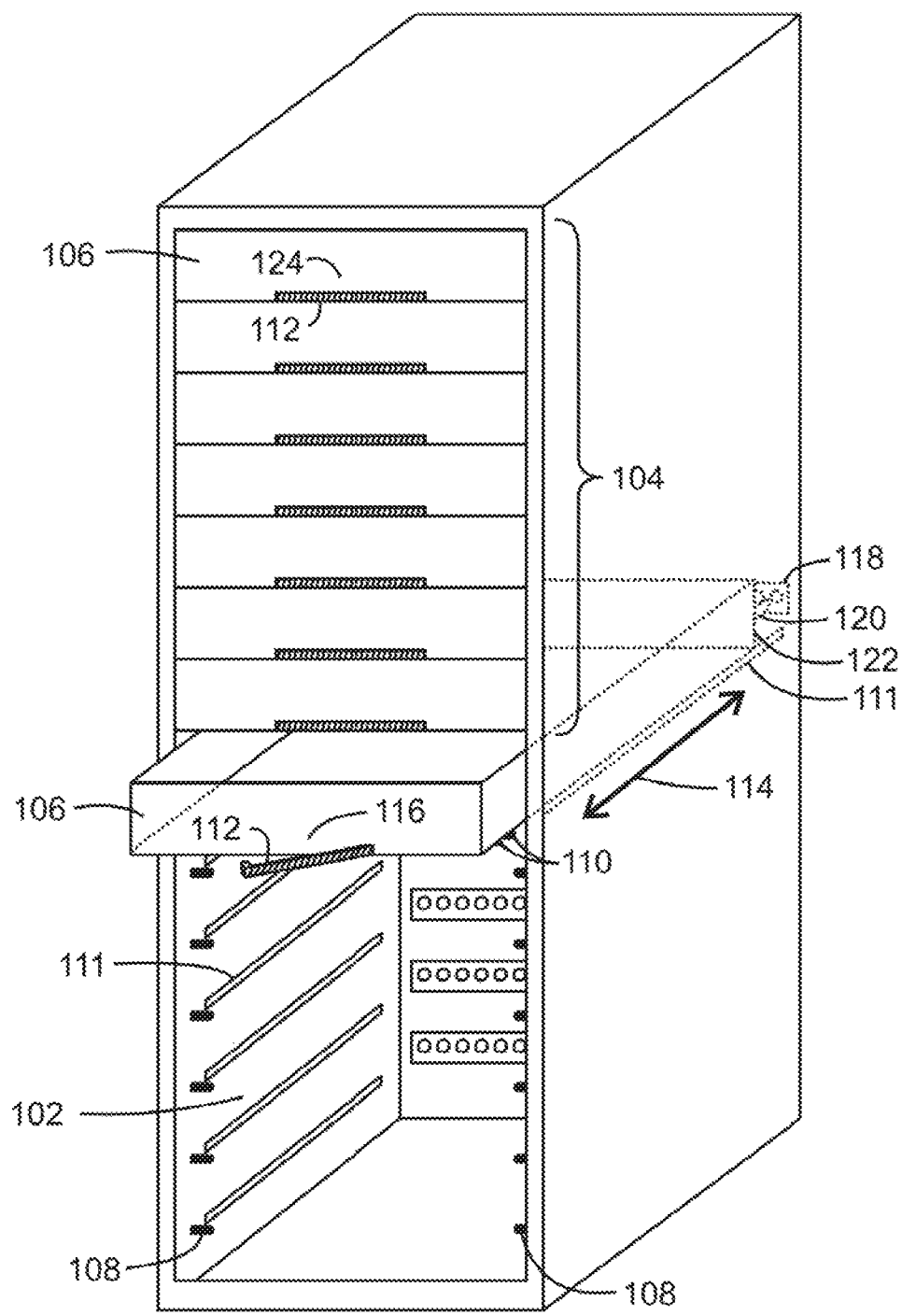
FIG. 1 is a perspective view of a frame that includes a number of slots for mounting a number of removable computing components, according to an example.

FIG. 1 is a perspective view of a frame 100 that includes a number of slots 102 for mounting a number of removable computing components 104. A removable computing component 106 may include a switch, a network storage device, a server, a media device, communication equipment, among others. The frame 100, along with the removable computing component 106, may be utilized in a computing data center for the centralized storage, management, and dissemination of data associated with information technology (IT) operations and equipment.

The removable computing component 106 may include latching mechanisms 110 on each of its respective side surfaces, as described with respect to the following figures. During the insertion of the removable computing component 106 into the slot 102, the latching mechanisms 110 may engage with the holding pins 108 of the frame 100. Thus, each holding pin 108 and the latching mechanisms 110 may work in unison to support and secure the removable computing component 106 as it slides into the slot 102. For added support, the frame 100 may include sliding rails 111 to stabilize the removable computing component 106 during insertion and removal. For example, the frame 100 may include a rail ridge 111 on each of its horizontal sides that may be, for example, located behind and in the same plane as the holding pins 108 to support the removable component 106.

A single touch point, e.g., a lever arm 112, may be located on a front face of the removable computing component 106 and accessible to a user for aiding in the insertion or removal of the removable computing component 106. The user may use the lever arm 112 to facilitate the inward and outward sliding motion of the removable computing component 106, as represented by a bi-directional arrow 114. The lever arm 112 may be any suitable handle mechanism configured for manual handling by the user. The lever arm 112 may be operatively coupled with the latching mechanisms 110 within the interior of the removable computing component 106. In operation, the removable computing component 106 may be placed into the slot 102, resting on the holding pins 108 and rail 111, to slide backwards into the frame 100. When the holding pins 108 reach the latching mechanisms 110, the removal computing component 106 may stop until the user closes the level arm 112. As shown in FIG. 1, the lever arm 112 is in an open position 116. Closing the lever arm 112 moves the latching mechanisms 110, which engage with the holding pins 108 and moves the removable computing component 106 back into the frame 100.

Within the slot 102, a first electrical connector, e.g., a socket 118, may be located on a back wall of the frame 100. The removable computing component 106 may include a second electrical connector, e.g., a pin connector 120, extending from a rear external surface 122. Electrical connectivity can be established between the removable computing component 106 and the frame 100 when the pin connector 120 is fully inserted into the socket 118. The electrical connection may include an electrical and/or network connection, such as a power connection, an Ethernet connection, a fiber optic connection, a coaxial connection, among other electrical connections. Further, any number of different connectors and configurations may be used, such as edge connectors on a circuit board inserting into slot connectors on the frame 100, among others.

Closing the lever arm 112 may provide sufficient leverage and force to engage the connectors on the removable computing component 106 with the connectors on the frame 100, such as forcing the pin connector 120 with into the socket 118. This facilitates electrical connectivity between the removable computing component 106 and the frame 100. As shown in FIG. 1, once the lever arm 112 is closed, and electrical connectivity is made, the lever arm 112 is locked in a closed position 124, holding the removable computing component 106 in place until removal is desired.

The use of a single lever arm 112 to activate the latching mechanisms 110 may provide a substantially balanced force on both sides of the removable computing component 106 when it is inserted into or removed from the frame 100. The substantially balanced force may reduce or eliminate the effect of binding of the pin connector 120 during insertion into the socket 118 of the frame 100.

Figure 2A:
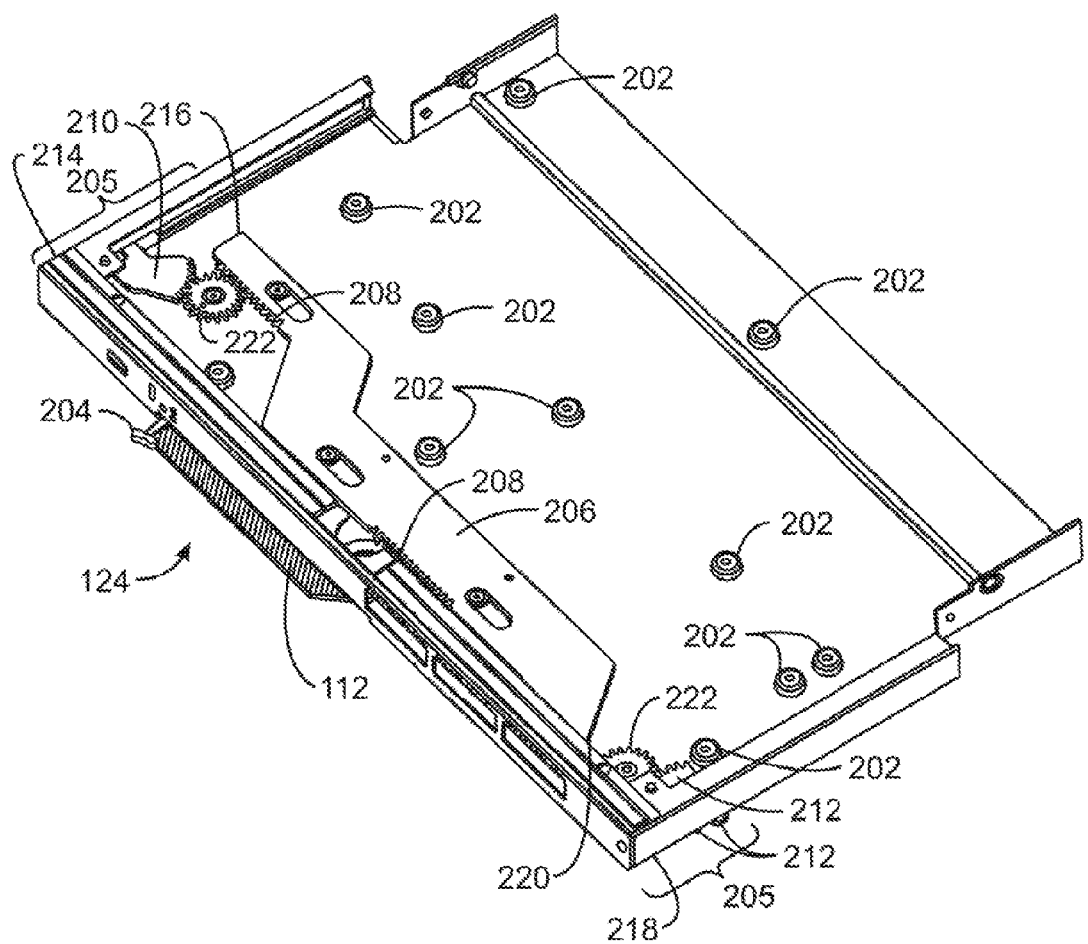
FIG. 2A is a perspective view of a carrier tray with a lever arm in a closed position, according to an example.

FIG. 2A is a perspective view of a carrier tray 200 with a lever arm 112 in a closed position 124. Like numbers are as described with respect to FIG. 1. The removable computing component 106, as described with respect to FIG. 1, may include the carrier tray 200 and an attached circuit board, for example, secured to mounting holes 202 on the carrier tray 200.

Referring also to FIG. 1, the carrier tray 200 may include a lever arm 112 that may be in a closed position 124 to hold the removable computing component 106 in a slot 102. A catch 204 may be utilized to secure the lever arm 112 in the closed position 124 after the insertion of the removable computing component 106 into the slot 102. The catch 204 may be released from the lever arm 112 to allow the lever arm 112 to move to an open position 116 so that the carrier tray 202 may be released from the slot 102. This will be discussed with respect to FIG. 3.

The carrier tray 200 may include a latching mechanism 205. The latching mechanism 205 may include several component parts to facilitate the removal and insertion of the carrier tray 200. The latching mechanism 205 may include a sliding rack gear 206 disposed within the interior of the carrier tray 200. The sliding rack gear 206 has a plurality of gear teeth 208. The location of the plurality of the gear teeth 208 may vary depending on the design of the latching mechanism 205.

The latching mechanism 205 may include a first latching member 210 and a second latching member 212. The first latching member 210 may be located along a first side 214 of the carrier tray 200 and at a first end 216 of the sliding rack gear 206. Additionally, the second latching member 212 may be located along a second side 218 of the carrier tray 200 and at a second end 220 of the sliding rack gear 206. As shown in FIG. 2A, a plurality of gears 222 may operatively couple the first latching member 210 and the first end 216 of the sliding rack gear 206 and the second latching member 212 and the second end 220 of the sliding rack gear 206. In operation, the teeth of plurality of gears 222 may mate with the plurality of gear teeth 208 of the sliding rack gear 206, the teeth of the first latching mechanism 210, and the teeth of the second latching mechanism 212.

The lever arm 112, which may be accessed from a front face of the carrier tray 200, may be a component of the latching mechanism 205. The movement of the lever arm 112 by a user actuates the sliding rack gear 206, which simultaneously rotates the first latching member 210 and the second latching member 212, for example, to engage with the pins on a frame 100, as discussed with respect to FIG. 1. By actuating the lever arm 112, the first latching member 210 and the second latching 212 may simultaneously provide a substantially balanced force on each side of the carrier tray 200 during insertion of the carrier tray 200. The substantially balanced force may facilitate a smooth transition from a closed position 124 to an open position 116 for the lever arm 112, or vice versa, as the carrier tray 200 is inserted or removed from the frame.

Figure 2B:
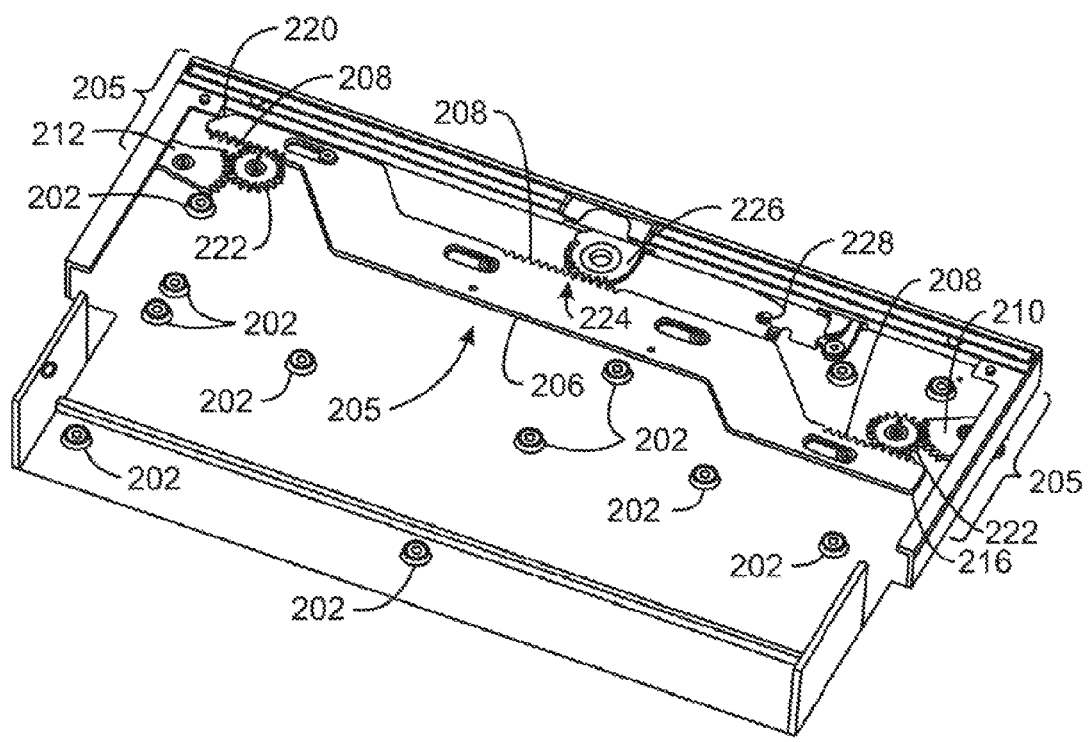
FIG. 2B is another perspective view of the carrier tray with a lever arm in a closed position, according to an example.

FIG. 2B is another perspective view of the carrier tray 200 with a lever arm 112 in a closed position 124. Like numbers are as described with respect to FIGS. 1 and 2A. As shown in FIG. 2B, the lever arm 112 may include a gear mechanism 226 disposed within the interior of the carrier tray 200 that may engaged with the gear teeth 208 located in the center position 224 of the sliding rack gear 206.

The actuation of the lever arm into either a closed position or an open position moves the sliding rack gear 206. The movement of the gear teeth 208 of the sliding rack gear 206 at its first end 216 and its second end 220 rotate the gears 222 at each end, turning the first latching mechanism 210, and the second latching mechanism 212. The mechanical advantage, or leverage, produced by the components of the latching mechanism 205 may provide a smooth transition for the carrier tray 200 during insertion or removal from a slot.

As shown in FIG. 2B, a resilient member, e.g., a spring 228, may be a component of the latching mechanism 205 that may work in conjunction with the lever arm 112. Specifically, the spring 228 may be configured to provide a force upon the lever arm 112, to assist in moving it to an open position during the removal of the carrier tray 200 from the slot. The open position 116 of the lever arm 112 is discussed more fully with respect to FIG. 3. In the closed position 124, the spring 228 provides tension against the catch 204, which may keep the lever arm 112 in a static position.

As depicted in FIG. 2B, the mounting points 202 are located on a bottom surface of the carrier tray 200 and are used to hold a circuit board, or other components, to the carrier tray 200. The mounting points 230 may be fixed points on the carrier tray 200 and may be spaced apart and located intermittently so as to secure and/or electrically connect a circuit component to the carrier tray 200. The mounting points 230 may be made of a solder material and configured in various shapes including mounds, balls, squares, etc. The attachment of the circuit component to the mounting points 230 will be described in further detail with respect to FIG. 4.

Figure 3:
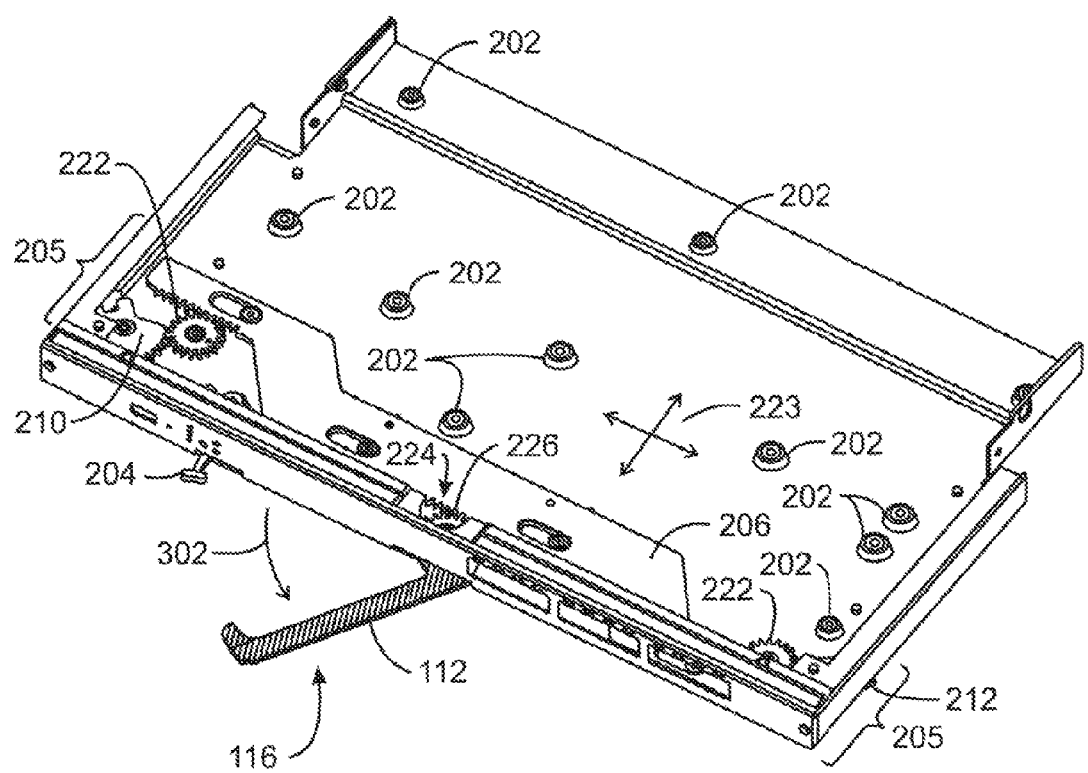
FIG. 3 is an perspective view of a carrier tray with a lever arm in an open position, according to an example.

FIG. 3 is a perspective view of a carrier tray 200 with a lever arm 112 in an open position. Like numbers are as described with respect to FIGS. 1, 2A, and 2B. An open position 116 of the lever arm 112 of the carrier tray 200 may be associated with the removal of the carrier tray 200 from a slot. As shown in FIG. 3, a catch 204 may be actuated by a user to release the lever arm 112 from a closed position 124, as discussed with respect to FIGS. 2A and 2B. The release of the lever arm 112 allows the carrier tray 200 to be moved by a user. To fully release the lever arm 112 into the open position 116, the user may pull the lever arm 112 in a forward direction, as indicated by an arrow 302. Through the use of a gear mechanism 226 of the lever arm 112, the progression of the forward motion 302 may slide a sliding rack gear 206 in a single X-Y plane 223 via gear teeth 208 at a center position 224. Simultaneously, as discussed with respect to FIGS. 2A and 2B, the movement of the sliding rack gear 206 may rotate a first latching mechanism 210 and a second latching mechanism 212 (not visible in FIG. 3).

Figure 4:
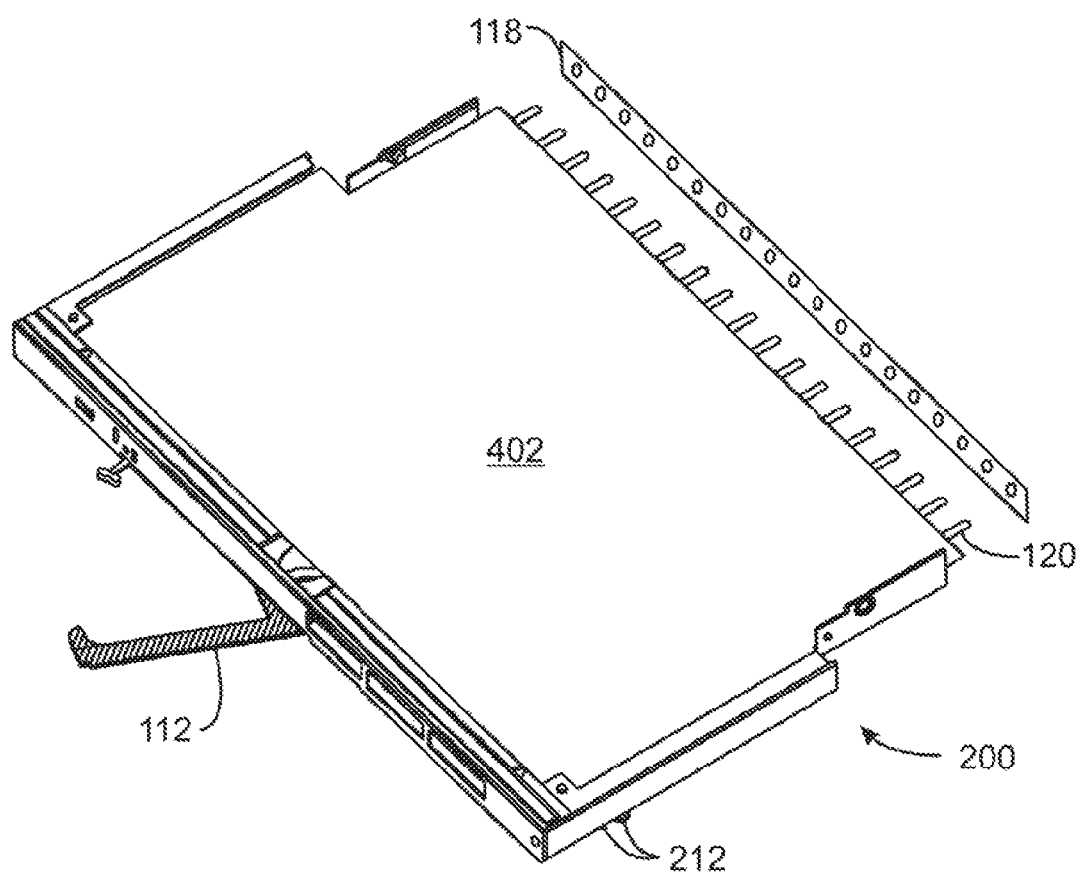
FIG. 4 is a perspective view of a circuit component secured to a bottom interior surface of a carrier tray, according to an example.

FIG. 4 is a perspective view of a circuit component 402 secured to a bottom interior surface of a carrier tray 200. Like numbers are as described with respect to FIGS. 1, 2A, and 2B. The carrier tray 200 may hold an attached circuit component, such as a printed circuit board (PCB) 402, among others. The PCB 402 may be positioned to overlay and align with mounting points, as discussed with respect to FIGS. 2A and 2B. The PCB 402 may be electrically and/or physically mounted onto the carrier tray 200 using the mounting points 230. In particular, the PCB 402 may be electrically attached to the carrier tray 200 via the mounting points by using conductive pathways, electrical wiring tracks, signal traces, or the like. The PCB 402 may also act as a physical base for the mounting of other electrical components, e.g., resistors, transistors, capacitors, and may connect such electrical components to other parts of the carrier tray 200 through the use of conducting traces or wires. The PCB 402 may be physically attached to the carrier tray 200 using a type of mechanical connection, e.g., soldered, screwed, welded, that yields a secure connection between the carrier tray 200 and the PCB 402. In addition to a PCB 402, the circuit component may include wire wrap construction, point-to-point construction, or any type of substrate that may be mechanically and/or electrically connected to the carrier tray 200.

As shown in FIG. 4, the PCB 402 may include pin connectors 120 that extend from a surface so as to extend along the back of the carrier tray 200 to facilitate electrical connectivity with other components. During the insertion of the carrier tray 200 into a frame, the pin connectors 120 may be inserted into a socket 118 of the frame. As described herein, the use of a single lever arm 112 may balance the forces applied to the carrier tray 200 during insertion.

Figure 5:
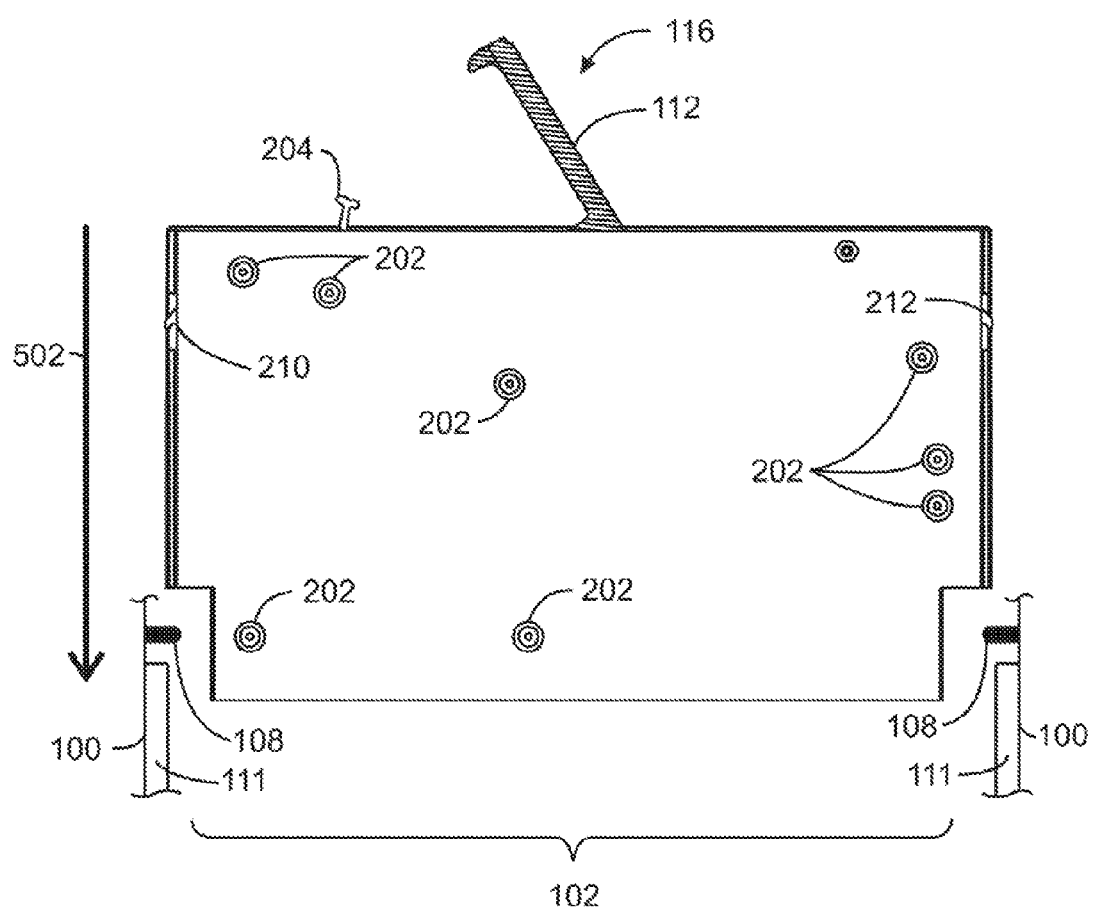
FIG. 5 is a view of a bottom of a carrier tray with a lever arm in an open position before insertion into a slot in a frame, according to an example.

FIG. 5 is a view of a bottom of a carrier tray 200 with a lever arm 112 in an open position 116 before insertion into a slot 102 in a frame 100. Like numbers are as described with respect to FIGS. 1, 2A, and 3. The lever arm 112 is left in the open position 116 during insertion of the carrier tray 200. In the open position 116, the lever arm 112 may extend outward from the carrier tray 200. Using manual force, the carrier tray 200 may slide in a direction 502 so as to be inserted into a slot 102 of the frame 100. The frame 100 may include holding pins 108 and a rail 111 disposed on each of its internal sidewalls to support the insertion of the carrier tray 200. The carrier tray 200 may include a first latching mechanism 210 and a second latching mechanism 212 where each latching mechanism includes a portion that extends slightly outside of the perimeter of the carrier tray 200. During the insertion of the carrier tray 200, the latching mechanisms 210 and 212 contact the holding pins 108, stopping the insertion of the carrier tray, for example, at the point where connectors on a removable computing component are close to engaging with connectors of the frame 100, as described with respect to FIG. 1.

Figure 6:
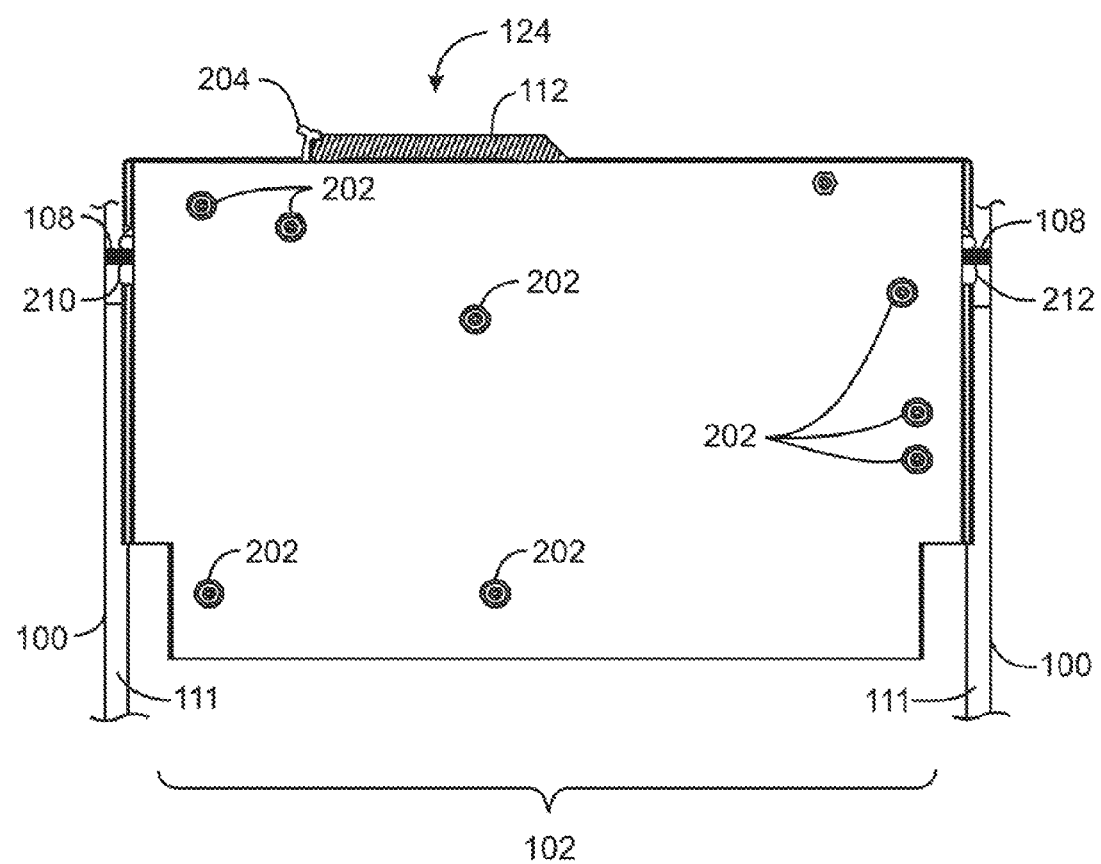
FIG. 6 is a view of a bottom of the carrier tray with a lever arm in a closed position after insertion into a slot in a frame, according to an example.

FIG. 6 is a schematic of a view of a bottom of a carrier tray 200 with a lever arm 112 in a closed position 124 after insertion into a slot 102 in a frame 100. Like numbers are as described with respect to FIGS. 1 and 2A. FIG. 6 illustrates a carrier tray 200 that may be fully inserted into a frame 100. As a user pushes the lever arm 112 into the closed position 124, the latching mechanisms 210 and 212 rotate around and engage the holding pins 108 located on each of the internal sidewalls of the frame 100. As shown in FIG. 6, the closed position 124 of the lever arm 112 may be secured using a catch 204.

Figure 7:
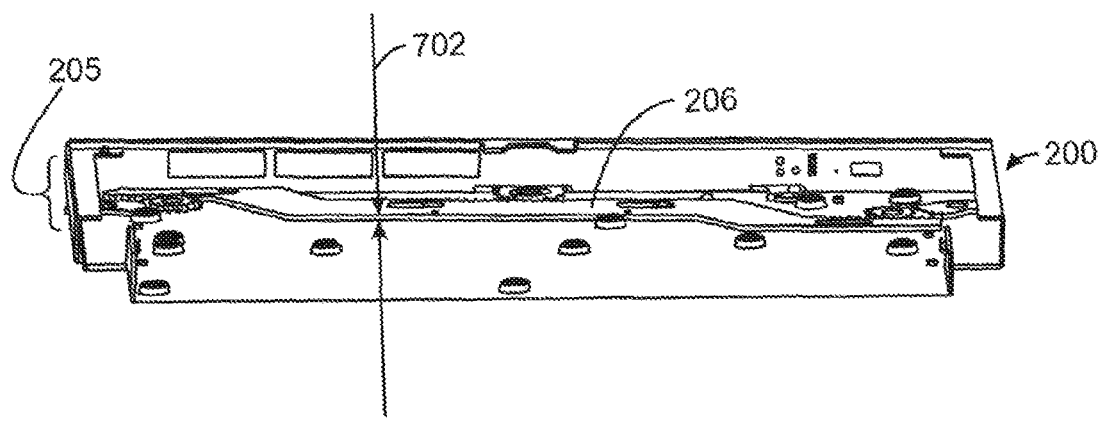
FIG. 7 is a perspective view of a sliding rack gear in a carrier tray, according to an example.

FIG. 7 is a perspective view 700 of a sliding rack gear 206 in a carrier tray 200. Like numbers are as described with respect to FIG. 2A. The latching mechanism 205, as previously described, is configured to facilitate the engagement of connectors on a removable computing component into connectors on a slot of a frame. The present disclosure may provide a low-profile latching mechanism to minimize the spacing required for a typical latching mechanism in an effort to maximum the spacing available for the installation of circuit components to be housed within the carrier tray.

As shown in FIG. 7, the sliding rack gear 206, as a component of a latching mechanism 205, may have a low profile design 702, i.e., a preferred maximum height of less than approximately 1.0 mm in material thickness. The low profile design for the sliding rack gear 206 provides additional spacing for removable computing components in a computing center.

Figure 8:
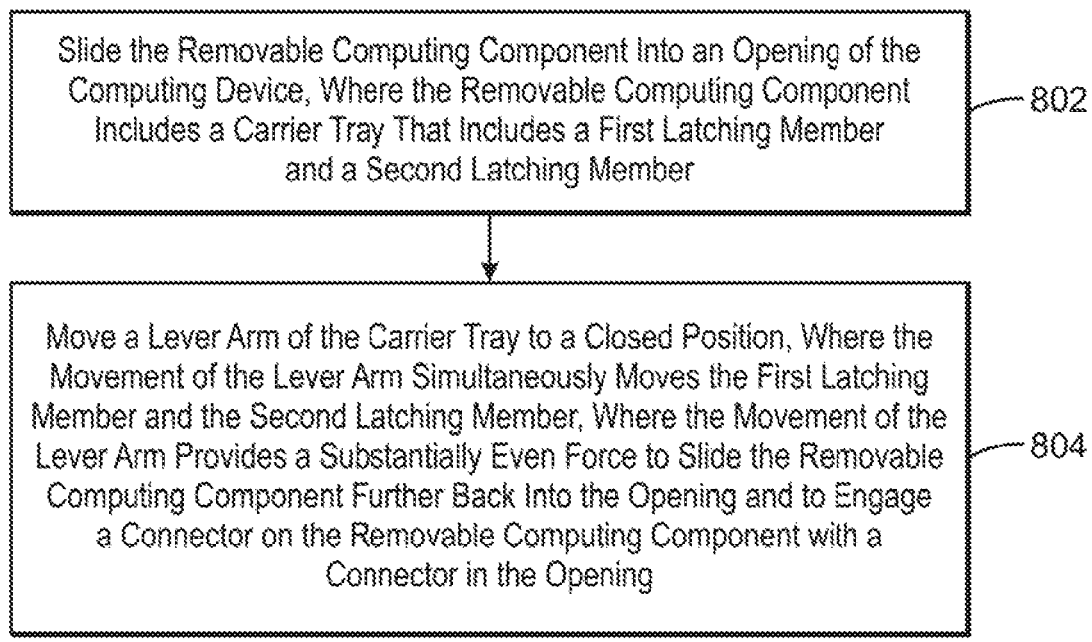
FIG. 8 is a method of installing a removable computing component in a computing device, according to an example.

FIG. 8 is a method 800 of installing a removable computing component in a computing device. The insertion of a removable computing component into a slot of a frame may facilitate electrical connectivity with circuit components located within the removable computing component and other devices located within the frame. Specifically, the circuit components may be located in a carrier tray of the removable computing component and may include pin connectors that mate with a socket of the frame. An increase in the friction between the pin connectors and the socket or an unbalanced pressure exerted on the pin connectors may hinder mating between the pin connectors and the socket. In particular, a disproportionate force applied to the carrier tray may cause binding or breaking of the pin connectors. The present techniques provides a balanced displacement force upon both sides of the carrier tray using a latching mechanism configured with other components, including a single lever arm and first and second latching mechanisms.

At block 802, a removable computing component may slide into an opening of a computing device, wherein the removable computing component comprises a carrier tray that comprises a first latching member and a second latching member. The carrier tray may also embody other components including a lever arm accessible to a user and located on a front external face of the carrier tray. At block 804, the lever arm of the carrier tray is moved to a closed position, where the movement of the lever arm simultaneously moves the first latching member and the second latching member. Additionally, the movement of the lever arm may provide a substantially even force to slide the removable computing component further back into the opening and may engage a connector on the removable computing component with a connector in the opening.

The removable computing component may refer to a component system, a device, or apparatus that includes processors, memory, input/output devices, interfaces, storage resources, circuit boards, motherboards, power sources, among others. The data center may be used to house the removable computing component and its associated electronic components. It is to be understood that the figures of the disclosure are not intended to indicate that all of the components discussed above are to be included in the computer device. Any number of additional components not discussed with the respect to figures may be included within the computer device, depending on the specific implementation.

While the present techniques may be susceptible to various modifications and alternative forms, the embodiments discussed above have been shown only by way of example. However, it should again be understood that the techniques is not intended to be limited to the particular embodiments disclosed herein. Indeed, the present techniques include all alternatives, modifications, and equivalents falling within the true spirit and scope of the appended claims.

What is claimed is:

1. A carrier tray comprising a latching mechanism, wherein the latching mechanism comprises:
   a sliding rack gear, wherein the sliding rack gear comprises a plurality of gear teeth;
   a lever arm disposed on a front edge of the carrier tray, wherein the lever arm includes a gear mechanism disposed within an interior of the carrier tray and engaged with the plurality of gear teeth on the sliding rack gear;
   a plurality of gears, wherein the plurality of gears operatively couples the sliding rack gear with a first latching member and a second latching member;
   the first latching member disposed along a first side of the carrier tray and at a first end of the sliding rack gear;
   the second latching member disposed along a second side of the carrier tray, opposite the first latching member, and at a second end of the sliding rack gear; and
   wherein a movement of the lever arm to a closed position moves the sliding rack gear, and the movement of the sliding rack gear substantially simultaneously rotates the first latching member and the second latching member.

2. The carrier tray of claim 1, comprising mounting points to mount a circuit board to the carrier tray, wherein the circuit board comprises connectors located on an edge of the carrier tray opposite to the lever arm.

3. The carrier tray of claim 1, wherein the first latching member and the second latching member provide a substantially even force at each side of the carrier tray as the lever arm is moved to the closed position.

4. The carrier tray of claim 2, wherein the first latching member and the second latching member push the connectors into mating connectors of a frame as the lever arm is moved to the closed position.

5. The carrier tray of claim 1, comprising a catch to secure the lever arm in a locked position or to release the lever arm in an open position.

6. The carrier tray of claim 5, comprising a resilient member to hold the catch when the lever arm is in the closed position.

7. The carrier tray of claim 1, wherein the sliding rack gear includes a low profile of a height of less than about 1 mm in material thickness.

8. A computing device, comprising:
   a slot comprising:
      an opening to accept insertion of a carrier tray;
      pins disposed at each side of the opening; and
      a first electrical connector disposed at a back of the opening;
   the carrier tray, comprising:
      a latching mechanism, comprising:
         a sliding rack gear, wherein the sliding rack gear comprises a plurality of gear teeth;
         a lever arm disposed on a front edge of the carrier tray, wherein the lever arm includes a gear mechanism disposed within an interior of the carrier tray and engaged with the plurality of gear teeth;
         a plurality of gears, wherein the plurality of gears operatively couples the sliding rack gear with a first latching member and a second latching member;
         the first latching member disposed along a first side of the carrier tray and at a first end of the sliding rack gear;
         the second latching member disposed along a second side of the carrier tray, opposite the first latching member, and at a second end of the sliding rack gear; and
            wherein a movement of the lever arm to a closed position moves the sliding rack gear, and the movement of the sliding rack gear substantially simultaneously rotates the first latching member and the second latching member, wherein each engages with the pins at each side of the opening; and
      a circuit board mounted to the carrier tray, wherein the circuit board comprises a second electrical connector disposed along a back edge of the carrier tray, opposite the lever arm, wherein pressure from the first latching member and the second latching member against the pins is sufficient to couple the second electrical connector with the first electrical connector.

9. The computing device of claim 8, wherein a catch secures the lever arm in a closed position when the first electrical connector is coupled to the second electrical connector.

10. The computing device of claim 8, wherein the first latching member and the second latching member provide a balanced sliding force upon the carrier tray as it is removed or inserted into the slot.

11. The computing device of claim 10, wherein the first electrical connector and the second electrical connector are coupled under the balanced sliding force.

* * * * *